(12) United States Patent
Kirby

(10) Patent No.: US 10,872,843 B2
(45) Date of Patent: Dec. 22, 2020

(54) SEMICONDUCTOR DEVICES WITH BACK-SIDE COILS FOR WIRELESS SIGNAL AND POWER COUPLING

(71) Applicant: Micron Technology, Inc., Boise, ID (US)

(72) Inventor: Kyle K. Kirby, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/584,278

(22) Filed: May 2, 2017

(65) Prior Publication Data

US 2018/0323133 A1 Nov. 8, 2018

(51) Int. Cl.
*H01L 23/48* (2006.01)
*H01L 49/02* (2006.01)
(Continued)

(52) U.S. Cl.
CPC ........ *H01L 23/481* (2013.01); *H01L 23/5227* (2013.01); *H01L 23/5384* (2013.01);
(Continued)

(58) Field of Classification Search
CPC ........... H01L 21/76898; H01L 23/5384; H01L 28/10; H01L 2225/06541; H01L 23/5227; H01L 25/0657; H01L 23/481
See application file for complete search history.

(56) References Cited

U.S. PATENT DOCUMENTS 5,095,357 A * 3/1992 Andoh ................ H01F 17/0006
257/379
5,852,866 A 12/1998 Kuettner et al.
(Continued)

FOREIGN PATENT DOCUMENTS

CN 102341870 A 2/2012
CN 106024722 A 10/2016
(Continued)

OTHER PUBLICATIONS

U.S. Appl. No. 15/584,310—Unpublished Patent Application by Kyle K. Kirby, titled "Semiconductor Devices With Through-Substrate Coils for Wireless Signal and Power Coupling", filed May 2, 2017, 27 pages.
(Continued)

*Primary Examiner* — Samuel A Gebremariam
*Assistant Examiner* — Jonas T Beardsley
(74) *Attorney, Agent, or Firm* — Perkins Coie LLP

(57) ABSTRACT

A semiconductor device includes a substrate, a plurality of circuit elements on a front side of the substrate, and a first substantially spiral-shaped conductor on a back side of the substrate is provided. The device further includes a first through-substrate via (TSV) electrically connecting a first end of the substantially spiral-shaped conductor to a first one of the plurality of circuit elements, and a second TSV electrically connecting a second end of the substantially spiral-shaped conductor to a second one of the plurality of circuit elements. The device may be a package further including a second die having a front side on which is disposed a second substantially spiral-shaped conductor. The front side of the second die is disposed facing the back side of the substrate, such that the first and second substantially spiral-shaped conductors are configured to wirelessly communicate.

8 Claims, 10 Drawing Sheets

(51) Int. Cl.
 *H01L 23/538* (2006.01)
 *H01L 25/065* (2006.01)
 *H01L 23/522* (2006.01)

(52) U.S. Cl.
 CPC ......... *H01L 25/0657* (2013.01); *H01L 28/10* (2013.01); *H01L 2224/32145* (2013.01); *H01L 2225/06531* (2013.01); *H01L 2225/06541* (2013.01)

(56) References Cited

U.S. PATENT DOCUMENTS

| | | | |
|---|---|---|---|
| 7,404,249 B2 | 7/2008 | Gardes et al. | |
| 8,791,501 B1* | 7/2014 | Fuentes | H01L 28/10 257/154 |
| 2009/0140383 A1 | 6/2009 | Chang et al. | |
| 2009/0243035 A1* | 10/2009 | Mashino | H01L 23/48 257/531 |
| 2009/0267084 A1 | 10/2009 | Bilger et al. | |
| 2009/0283854 A1 | 11/2009 | Levy et al. | |
| 2010/0164671 A1 | 7/2010 | Pagani et al. | |
| 2010/0327824 A1 | 12/2010 | Dellacona | |
| 2011/0073987 A1 | 3/2011 | Mackh et al. | |
| 2011/0084782 A1* | 4/2011 | Kanno | H01Q 1/38 333/202 |
| 2011/0156488 A1 | 6/2011 | Kuroda | |
| 2012/0068301 A1* | 3/2012 | Sin | H01L 23/645 257/531 |
| 2012/0162947 A1 | 6/2012 | Odonnell et al. | |
| 2012/0187530 A1 | 7/2012 | Zhang et al. | |
| 2013/0056847 A1 | 3/2013 | Chen | |
| 2013/0063234 A1 | 3/2013 | Kamath et al. | |
| 2013/0168809 A1 | 7/2013 | Yen et al. | |
| 2013/0181534 A1 | 7/2013 | Jin et al. | |
| 2013/0187255 A1 | 7/2013 | Wang et al. | |
| 2013/0321094 A1* | 12/2013 | Sumida | H01L 23/481 333/24.2 |
| 2014/0061854 A1 | 3/2014 | Chen | |
| 2014/0131841 A1* | 5/2014 | Tseng | H01L 23/481 257/621 |
| 2014/0159196 A1 | 6/2014 | Mackh et al. | |
| 2014/0217546 A1 | 8/2014 | Yen et al. | |
| 2014/0225208 A1 | 8/2014 | Gu et al. | |
| 2014/0323046 A1* | 10/2014 | Asai | H01Q 1/2283 455/41.2 |
| 2015/0054710 A1 | 2/2015 | Lee et al. | |
| 2015/0115405 A1 | 4/2015 | Wu et al. | |
| 2015/0287773 A1 | 10/2015 | Wang et al. | |
| 2016/0109399 A1 | 4/2016 | O'Donnell et al. | |
| 2016/0148714 A1 | 5/2016 | Yoon | |
| 2017/0005046 A1* | 1/2017 | Sin | H01L 25/0657 |
| 2017/0178786 A1 | 6/2017 | Lambert et al. | |
| 2017/0330930 A1 | 11/2017 | Cook et al. | |
| 2017/0338034 A1 | 11/2017 | Yun et al. | |
| 2018/0323146 A1 | 11/2018 | Kirby | |
| 2018/0323253 A1 | 11/2018 | Kirby | |
| 2018/0323369 A1 | 11/2018 | Kirby | |
| 2019/0027437 A1 | 1/2019 | Kirby | |

FOREIGN PATENT DOCUMENTS

| | | |
|---|---|---|
| CN | 106206553 A | 12/2016 |
| EP | 0725407 A1 | 8/1996 |
| KR | 20110011691 U | 12/2011 |
| WO | 2014045518 A1 | 3/2014 |
| WO | 2014123790 A1 | 8/2014 |
| WO | 2015043419 A1 | 4/2015 |
| WO | 2016094651 A1 | 6/2016 |

OTHER PUBLICATIONS

U.S. Appl. No. 15/584,294—Unpublished Patent Application by Kyle K. Kirby, titled "Inductors With Through-Substrate Via Cores", filed May 2, 2017, 39 pages.
U.S. Appl. No. 15/584,881—Unpublished Patent Application by Kyle K. Kirby, titled "Multi-Die Inductors With Coupled Through-Substrate Via Cores", filed May 2, 2017, 41 pages.
U.S. Appl. No. 15/584,965—Unpublished Patent Application by Kyle K. Kirby, titled "3D Interconnect Multi-Die Inductors With Through-Substrate Via Cores", filed May 2, 2017, 50 pages.
TW Patent Application No. 107113943—Taiwanese Office Action and Search Report, dated Jul. 29, 2019, with English Translation, 19 pages.
TW Patent Application No. 107113945—Taiwanese Office Action and Search Report, dated Jul. 30, 2019, with English Translation, 17 pages.
International Application No. PCT/US2018/026239—International Search Report and Written Opinion, dated Jul. 26, 2018, 10 pages.
International Application No. PCT/US2018/026253—International Search Report and Written Opinion, dated Jul. 27, 2018, 13 pages.
International Application No. PCT/US2018/026256—International Search Report and Written Opinion, dated Jul. 4, 2018, 16 pages.
International Application No. PCT/US2018/026263—International Search Report and Written Opinion, dated Jul. 4, 2018, 16 pages.
International Application No. PCT/US2018/026269—International Search Report and Written Opinion, dated Jul. 5, 2018, 14 pages.
TW Patent Application No. 107113941—Taiwanese Office Action, dated Jan. 31, 2019, with English Translation, 12 pages.
TW Patent Application No. 107113943—Taiwanese Office Action and Search Report, dated Nov. 29, 2018, with English Translation, 11 pages.
TW Patent Application No. 107113945—Taiwanese Office Action and Search Report, dated Apr. 15, 2019, with English Translation, 12 pages.
TW Patent Application No. 107113957—Taiwanese Office Action and Search Report, dated Apr. 24, 2019, with English Translation, 11 pages.
TW Patent Application No. 107113942—Taiwanese Office Action and Search Report, dated May 14, 2019, with English Translation, 7 pages.
TW Patent Application No. 107113943—Taiwanese Office Action, dated Nov. 29, 2019, with English Translation, 12 pages.

* cited by examiner

SEMICONDUCTOR DEVICES WITH BACK-SIDE COILS FOR WIRELESS SIGNAL AND POWER COUPLING

CROSS-REFERENCE TO RELATED APPLICATION(S)

This application contains subject matter related to a concurrently-filed U.S. Patent Application by Kyle K. Kirby, entitled "SEMICONDUCTOR DEVICES WITH THROUGH-SUBSTRATE COILS FOR WIRELESS SIGNAL AND POWER COUPLING." The related application, of which the disclosure is incorporated by reference herein, is assigned to Micron Technology, Inc., and is identified as U.S. patent application Ser. No. 15/584,310, filed May 2, 2017.

This application contains subject matter related to a concurrently-filed U.S. Patent Application by Kyle K. Kirby, entitled "INDUCTORS WITH THROUGH-SUBSTRATE VIA CORES." The related application, of which the disclosure is incorporated by reference herein, is assigned to Micron Technology, Inc., and is identified as U.S. patent application Ser. No. 15/584,294, filed May 2, 2017.

This application contains subject matter related to a concurrently-filed U.S. Patent Application by Kyle K. Kirby, entitled "MULTI-DIE INDUCTORS WITH COUPLED THROUGH-SUBSTRATE VIA CORES." The related application, of which the disclosure is incorporated by reference herein, is assigned to Micron Technology, Inc., and is identified as U.S. patent application Ser. No. 15/584,881, filed May 2, 2017.

This application contains subject matter related to a concurrently-filed U.S. Patent Application by Kyle K. Kirby, entitled "3D INTERCONNECT MULTI-DIE INDUCTORS WITH THROUGH-SUBSTRATE VIA CORES." The related application, of which the disclosure is incorporated by reference herein, is assigned to Micron Technology, Inc., and is identified as U.S. patent application Ser. No. 15/584,965, filed May 2, 2017.

TECHNICAL FIELD

The present disclosure generally relates to semiconductor devices, and more particularly relates to semiconductor devices with back-side coils for wireless signal and power coupling.

BACKGROUND

Semiconductor devices are often provided in packages with multiple connected dies, in which circuit elements of the various dies are connected in various ways. For example, a multi-die package may utilize wire bonds from each die to an interposer to provide connection between elements in different dies. While direct electrical connections between circuit elements in different dies are sometimes desirable, in other cases it may be desirable to connect elements from different dies wirelessly (e.g., via inductive coupling, capacitive coupling, or the like). To facilitate wireless communication between circuit elements in different dies, planar coils can be provided on the dies, such that adjacent dies in a multi-die stack can have proximate coils that communicate wirelessly.

One approach to providing coils for wireless communication involves packaging two dies in a face-to-face arrangement, such that respective pairs of wireless coils on the front side (e.g., the active layer) of each die are placed in close proximity. This approach is illustrated schematically in FIG. 1, which shows two dies 101 and 102 with front-side coils, such as coils 111 and 112, being placed in proximity with one another. A face-to-face arrangement of dies with front side coils communicating wireless limits the number of dies that can be packaged together to two, however, so other approaches for larger numbers of dies have been sought.

Another approach to providing coils for wireless communication involves thinning the dies in a semiconductor package sufficiently so that the coils on the front side of each die in the package are separated by only about the height of the thinned die when packaged in a front-to-back arrangement. This approach is illustrated schematically in FIG. 2, in which three thinned dies 201, 202 and 203 are disposed in a front-to-back arrangement, such that the distance between coils in adjacent dies, such as between coils 211 and 212 or coils 212 and 213, is small enough to permit wireless communication. While this approach allows for packages with more than two dies, the distance between coils is much larger than in the arrangement of FIG. 1, and accordingly the size of the coils must be increased to compensate, which can dramatically increase the cost of the dies in the package. Accordingly, there is a need for other approaches to providing semiconductor devices with coils for wireless communication that permit more than two dies to be stacked without dramatically increasing the size of the coils.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As discussed above, semiconductor devices are continually designed with ever greater needs for wireless communication between dies in a semiconductor package. Accordingly, several embodiments of semiconductor devices in accordance with the present technology can provide back-side coils connected to front-side circuit elements by through-substrate vias, which can provide wireless communication to adjacent dies in a front-to-back arrangement while only consuming a small area.

Several embodiments of the present technology are directed to semiconductor devices, systems including semiconductor devices, and methods of making and operating semiconductor devices. In one embodiment, a semiconductor device comprises a substrate, a plurality of circuit elements on a front side of the substrate, and a substantially spiral-shaped conductor on a back side of the substrate. The semiconductor device further comprises a first through-substrate via ("TSV") electrically connecting a first end of the substantially spiral-shaped conductor to a first one of the plurality of circuit elements; and a second TSV electrically connecting a second end of the substantially spiral-shaped conductor to a second one of the plurality of circuit elements.

Figure 1:
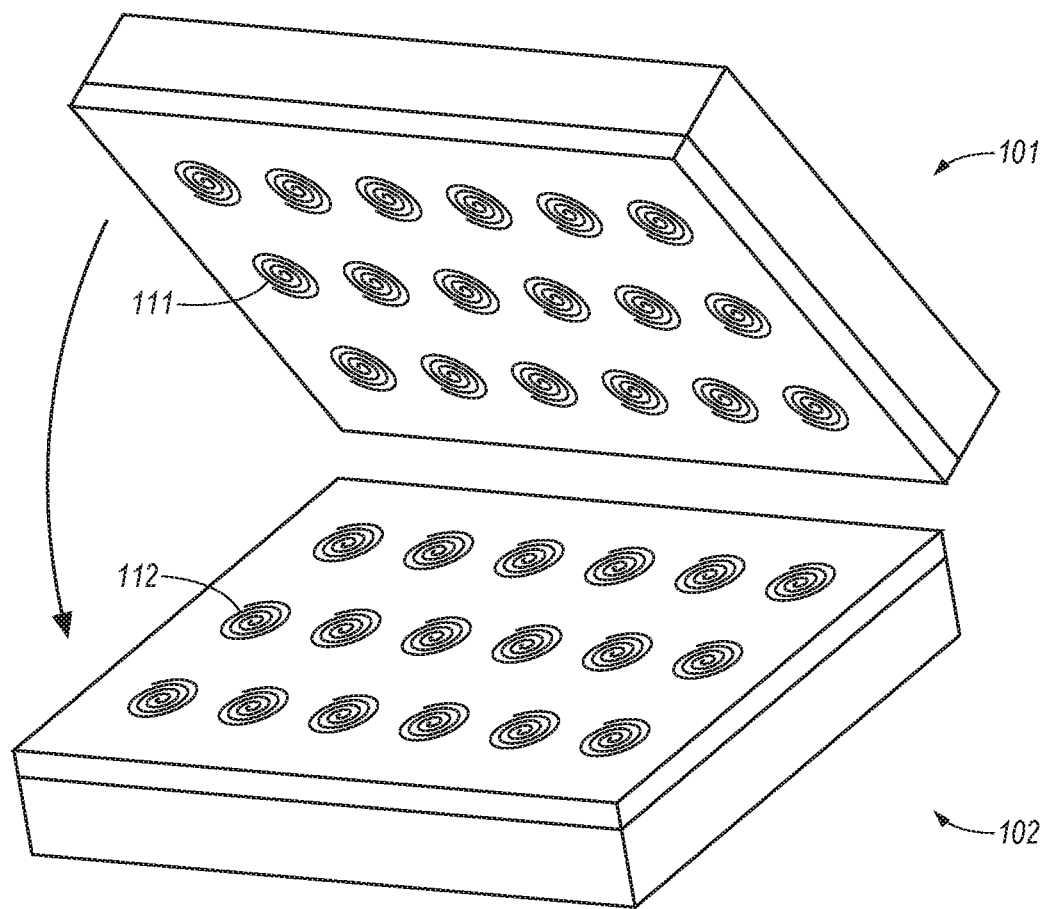
FIG. 1 is a simplified perspective view of a multi-die semiconductor device with front-side coils for wireless coupling.
Figure 2:
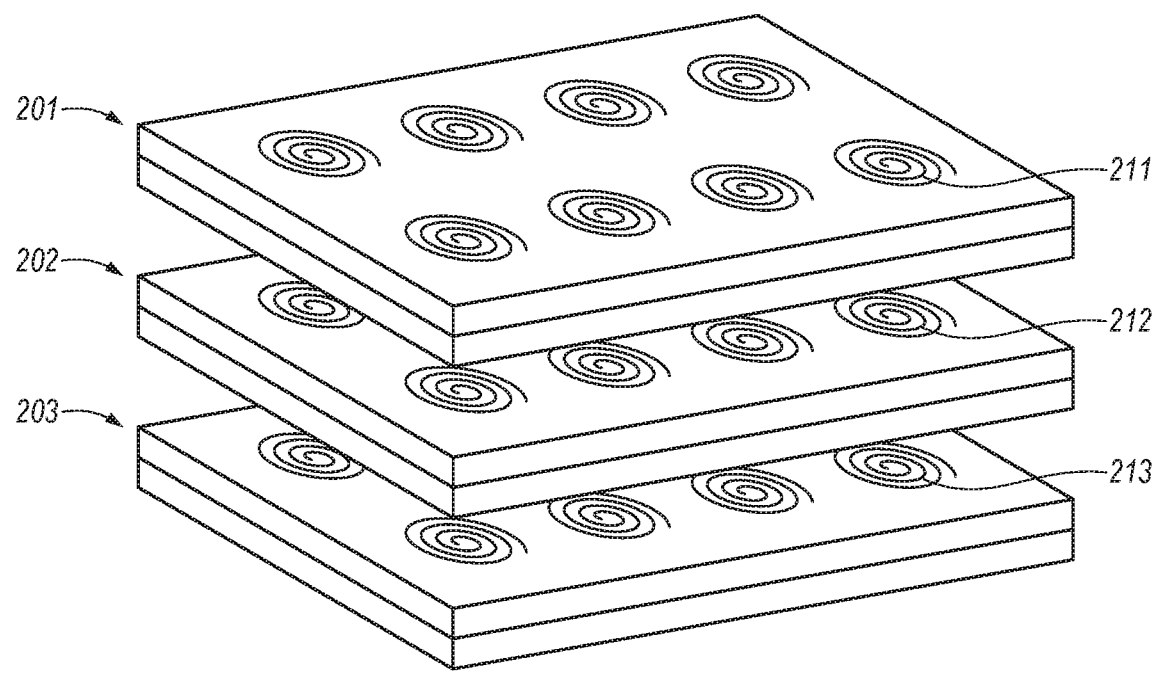
FIG. 2 is a simplified perspective view of a multi-die semiconductor device with front-side coils for wireless coupling.
Figure 3A:
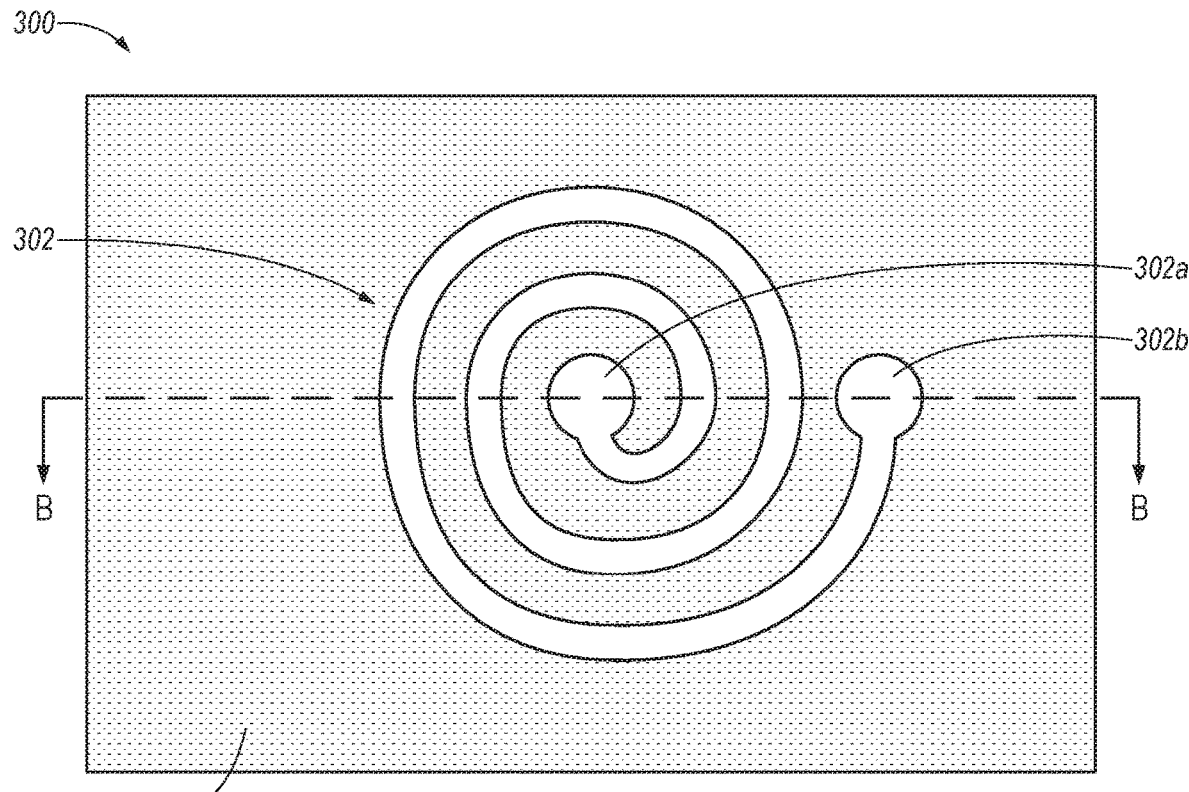
FIGS. 3A and 3B are simplified cross-sectional views of a semiconductor device with a back-side coil in accordance with an embodiment of the present technology.
Figure 3B:
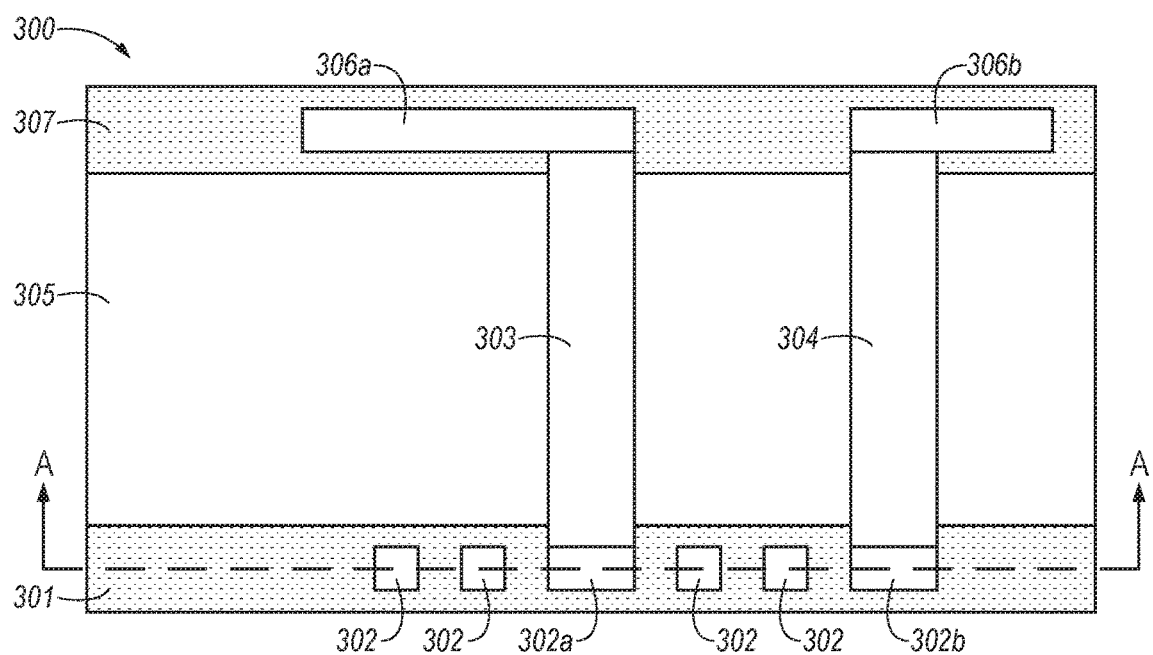

For example, FIGS. 3A and 3B illustrate a semiconductor device 300 with a back-side coil 302 for wireless communication in accordance with an embodiment of the present technology. FIG. 3A is a simplified cross-sectional view of the device 300 through the back-side coil 302 ("coil 302") in accordance with an embodiment of the present technology. The coil 302 is formed by a conductor (e.g., a conductive trace) connecting a first end 302a of the coil 302 to a second end 302b of the coil 302 along a substantially spiral-shaped path. The coil 302 is disposed in a lower layer 301 of insulating material on the back side of the device 300. As can be seen with reference to FIG. 3A, the coil 302 includes about two and one-half turns (e.g., the spiral-shaped path rotates around the first end 302a through about 900°). In accordance with one embodiment, the planar width of the conductive trace used to pattern coil 302 can be between about 0.1 and 0.5 µm, while the spacing between adjacent turns of the conductive trace can be about 0.5 and 3.0 µm.

Referring to FIG. 3B, the device 300 is shown in cross-section along the section line B-B in FIG. 3A. The device 300 includes a substrate 305, a first TSV 303 extending through the substrate 305 and connected to the first end 302a of the coil 302, and a second TSV 304 extending through the substrate 305 and connected to the second end 302b of the coil. Section line A-A indicates the cross section in which the device 300 is illustrated in FIG. 3A. The first TSV 303 can be connected to other circuit elements (not shown) in an upper layer 307 of insulating material on the front side of the device 300 by lead 306a. Similarly, the second TSV 304 can be connected to other circuit elements (not shown) in the upper layer 307 of insulating material by lead 306b. The TSVs 303 and 304 can be between about 2 and 50 µm in diameter.

According to one embodiment of the present technology, the coil 302 can include any one of a number of conductive materials compatible with standard semiconductor metallization processes, including copper, gold, tungsten, or alloys thereof. The substrate 305 can likewise include any one of a number of substrate materials suitable for semiconductor processing methods, including silicon, glass, gallium arsenide, gallium nitride, organic laminates, and the like. Additionally, integrated circuitry for memory, controllers, processors and the like can be formed on and/or in the substrate 305. As will be readily understood by those skilled in the art, a through-substrate via, such as the first and second TSVs 303 and 304, can be made by etching a high-aspect-ratio hole into the substrate 305 and filling it with one or more materials in one or more deposition and/or plating steps. The two TSVs 303 and 304 can include a bulk material with desirable conductive properties (e.g., copper, gold, tungsten, or alloys thereof), or can include multiple discrete layers, only some of which are conductive, in accordance with an embodiment of the present technology. For example, following a high-aspect ratio etch and a deposition of insulator, each of the first and second TSVs 303 and 304 can be provided in a single metallization step filling in the insulated opening with a conductive material. In another embodiment, each of the first and second TSVs 303 and 304 can be formed in multiple steps to provide coaxial layers of different materials. After providing TSVs of a desired height (e.g., about an eventual thickness of the substrate 305), the backside of the substrate can be etched or ground to expose a lowermost portion of the TSVs for connection to other elements (e.g., a back-side coil). For example, the substrate 305 can be a thinned silicon wafer of between about 10 and 100 µm thickness, and the TSVs 303 and 304 can extend through the substrate 305, such that a lowermost portion of the TSVs 303 and 304 can be exposed for electrical connection to the coil 302. Accordingly, unlike other circuit elements that are additively constructed on the front or back side of the substrate 305, the TSVs 303 and 304 extend substantially through the substrate 305, permitting electrical connection between circuit elements on opposite sides of the substrate 305.

Although in the example of FIG. 3, the coil 302 includes about two and one-half turns, in other embodiments, the number of turns of a coil can vary. For example, the efficiency of the inductive coupling between two planar spiral conductors (e.g., coils) can depend upon a number of turns of the coils, such that increasing the number of turns can permit more efficient wireless communication between the two coils (e.g., thereby increasing the distance at which coupled coils can communicate). As will be readily understood by one skilled in the art, however, increasing the number of turns will generally (e.g., where reduction in the size and spacing of the traces is not feasible) increase the area consumed by a coil, such that the number of turns for a coil may be selected based upon a desired balance among coil spacing, wireless communication efficiency and circuit area.

Figure 4:
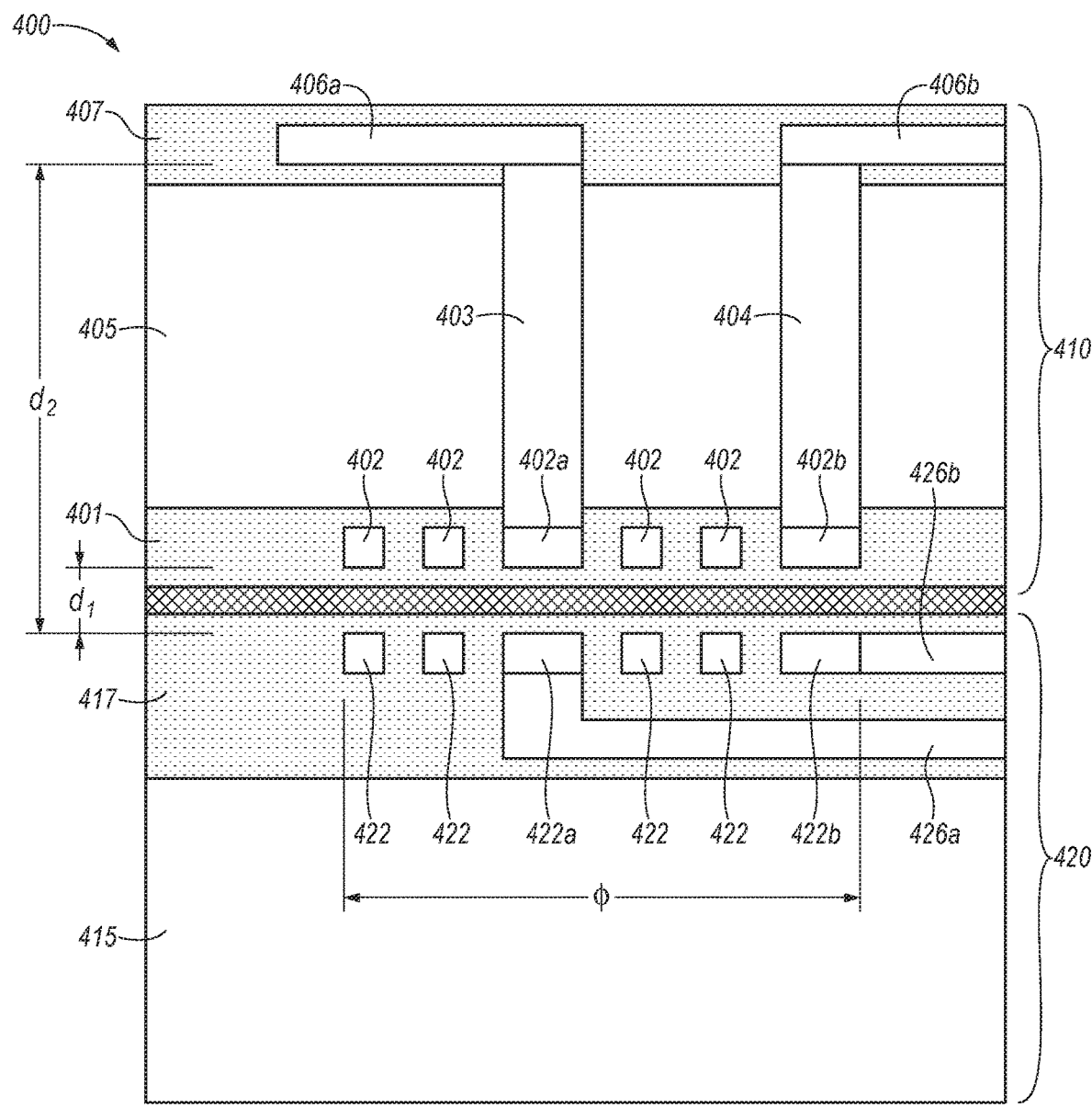
FIG. 4 is a simplified cross-sectional view of a multi-die semiconductor device with a back-side coil in accordance with an embodiment of the present technology.

By disposing a substantially spiral conductor on the back side of a substrate, embodiments of the present invention permit wireless communication with high efficiency between devices in a stack of dies oriented front-to-back. A back-side coil of one die can be located a short distance (e.g., of about the same order of magnitude as the bond line thickness) from a front-side coil of another die immediately below the backside coil, which provides a much smaller coil spacing (e.g., and therefore higher coupling efficiency) than is found between coupled coils on the front sides of two die oriented front-to-back (e.g., where the coil spacing is of about the same order of magnitude as the die thickness). For example, FIG. 4 is a simplified cross-sectional view of a multi-die semiconductor device with a back-side coil in accordance with an embodiment of the present technology.

The device 400 includes a first die 410 having a substrate 405 and a lower layer 401 of insulating material at the back side of the first die 410. The first die 410 further includes a back-side coil 402 ("coil 402") disposed in the lower layer 401 of insulating material. The coil 402 is formed by a conductor (e.g., a conductive trace) connecting a first end 402a of the coil 402 to a second end 402b of the coil 402 along a substantially spiral-shaped path. As can be seen with reference to FIG. 4, the coil 402 includes about two and one-half turns (e.g., the spiral-shaped path rotates around the first end 402a through about 900°). The first die 410 further includes a first TSV 403 extending through the substrate 405 and connected to the first end 402a of the coil 402, and a second TSV 404 extending through the substrate 405 and connected to the second end 402b of the coil 402. The first TSV 403 can be connected to other circuit elements (not shown) in an upper layer 407 of insulating material on the front side of the first die 410 by lead 406a. Similarly, the second TSV 404 can be connected to other circuit elements (not shown) in the upper layer 407 of insulating material by lead 406b.

The device further includes a second die 420 having a substrate 415 and an upper layer 417 of insulating material on the front side of the second die 420. The second die 420 further includes a front-side coil 422 ("coil 422") disposed in the upper layer 417 of insulating material. The coil 422 is formed by a conductor (e.g., a conductive trace) connecting a first end 422a of the coil 422 to a second end 422b of the coil 422 along a substantially spiral-shaped path. As can be seen with reference to FIG. 4, the coil 422 also includes about two and one-half turns (e.g., the spiral-shaped path rotates around the first end 422a through about 900°). The coil 422 can be connected to other circuit elements (not shown) in the upper layer 417 of insulating material on the front side of the second die 420 by leads 426a and 426b.

The first die 410 and the second die 420 are stacked front-to-back (e.g., the back side of the first die 410 is facing the front side of the second die 420). The device 400 may optionally include a die attach material 409 (e.g., a die attach film) between the first and second dies 410 and 420. As can be seen with reference to FIG. 4, the distance $d_1$ between the back side coil 402 of the first die 410 and the front side coil 422 of the second die 420 is a short distance (e.g., of about same order of magnitude as the bond line thickness). For example, the distance $d_1$ may be between about 5 and 30 μm. According to one embodiment, the distance $d_1$ between the two wirelessly communicating coils 402 and 422 is much less (e.g., about at least an order of magnitude less) than the area spanned by the two coils 402 and 422 (e.g., the diameter ø of the two coils 402 and 422). For example, in the example of FIG. 4, the diameter ø of the two coils 402 and 422 can be between about 80 and 600 μm. Moreover, the distance $d_1$ between the two wirelessly communicating coils 402 and 422 is much less (e.g., about at least an order of magnitude less) than the distance $d_2$ between the front-side coil 422 of the second die 420 and elements on the front side of the first die 410 (e.g., where a front-side coil would have to have been disposed in the absence of the back-side coil 402). For example, for the example of FIG. 4 in which the first die 410 is a thinned silicon wafer, the distance $d_2$ can be between about 70 and 250 μm.

Although in the example of FIG. 4 the back-side coil 402 and the front-side coil 422 have been illustrated as having the same diameter ø, in other embodiments wirelessly communicating coils in adjacent die (e.g., coupled front- and back-side coils) need not be the same size (e.g., or shape). For example, a back-side coil on a first die can be any size, including between about 80 and 600 μm, and a front-side coil on a second die (e.g., facing the back-side coil of the first die) can be a different size selected from the same range. Although matching coil sizes in wirelessly communicating coils can provide the most efficient use of space and least material cost, in some embodiments space constraints on one side may make it desirable to have coils of different sizes. For example, it may be desirable to provide a larger back-side coil because the space constraints on the back side are not as demanding as on the front side with its associated dense placement of circuit elements. This can facilitate easier alignment or provide slightly better coupling without increasing the size of the corresponding front-side coil.

In accordance with one aspect of the present technology, closely-spaced coils, such as coils 402 and 422, can be configured to wirelessly communicate over near-field distances (e.g., distances less than about three times the diameter ø of the coils, in which the near-field components of the electric and magnetic fields oscillate). For example, the back-side coil 402 and the front-side coil 422 can communicate wirelessly using inductive coupling, in which one of the coils (e.g., front-side coil 422 of die 420) is configured to induce a magnetic field with a flux perpendicular to and passing through both the coils 402 and 422 in response to a current passing through the front-side coil 422 (e.g., provided by a voltage differential applied across the leads 426a and 426b). By changing the current passing through the front-side coil 422 (e.g., by applying an alternating current, or by repeatedly switching between high and low voltage states), changes can be induced in the magnetic field, which in turn induces a changing current in the back-side coil 402 of the first die 410. In this fashion, signals and/or power can be coupled between a circuit comprising the back-side coil 402 of the first die 410 and another comprising the front-side coil 422 of the second die 420. Although the wireless communication between coils 402 and 422 has been described in the foregoing example with reference to inductive coupling, one skilled in the art will readily appreciate that wireless communication between such closely-spaced coils can be accomplished in any one of a number of other ways, including for example by resonant inductive coupling, capacitive coupling, or resonant capacitive coupling.

Although in the example of FIG. 4, the semiconductor device 400 has been illustrated having a pair of wirelessly communicating coils 402 and 422 having the same number of turns (e.g., two and one-half turns), embodiments of the present technology can provide semiconductor devices with wirelessly communicating coils having different numbers of turns. As will be readily understood by one skilled in the art, providing one coil in a pair of inductively-coupled coils with more turns than the other allows the pair of coupled coils to be operated as a step-up or step-down transformer. For example, the application of a first changing current (e.g., 4V of alternating current) to a coil with four turns will induce in a coil with three turns a changing current with a lower voltage (e.g., 3V of alternating current), given the 4:3 ratio of turns between the primary and secondary windings of the coupled inductors (e.g., coils) in this configuration.

Figure 5:
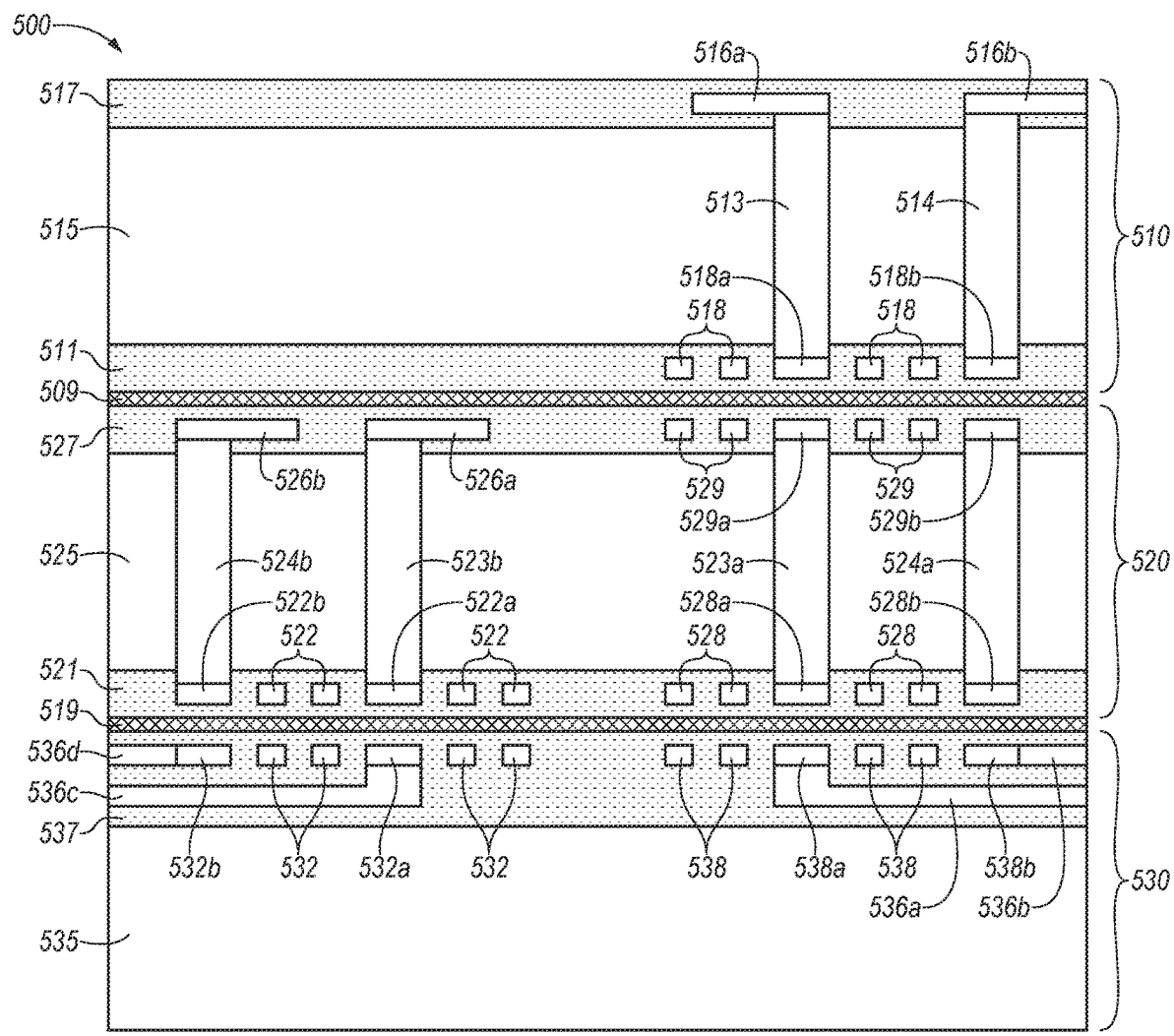
FIG. 5 is a simplified cross-sectional view of a multi-die semiconductor device with back-side coils in accordance with an embodiment of the present technology.

As set forth above, a benefit of providing a semiconductor device with a back-side coil for wireless communication is that packages of more than two die can be configured to wirelessly communicate, even when stacked in a front-to-back configuration. For example, FIG. 5 is a simplified cross-sectional view of a multi-die semiconductor device 500 with back-side coils in accordance with an embodiment of the present technology. The device 500 includes a first die 510 having a substrate 515 and a lower layer 511 of insulating material on the back side of the first die 510. The first die 510 further includes a back-side coil 518 ("coil 518") disposed in the lower layer 511 of insulating material. The coil 518 is formed by a conductor (e.g., a conductive trace) connecting a first end 518a of the coil 518 to a second end 518b of the coil 518 along a substantially spiral-shaped path. As can be seen with reference to FIG. 5, the coil 518 includes about two and one-half turns (e.g., the spiral-shaped path rotates around the first end 518a through about 900°). The first die 510 further includes a first TSV 513 extending through the substrate 515 and connected to the first end 518a of the coil 518, and a second TSV 514 extending through the substrate 515 and connected to the second end 518b of the coil 518. The first TSV 513 can be connected to other circuit elements (not shown) in an upper layer 517 of insulating material on the front side of the first die 510 by lead 516a. Similarly, the second TSV 514 can be connected to other circuit elements (not shown) in the upper layer 517 of insulating material of the first die 510 by lead 516b.

The device further includes a second die 520 having a substrate 525 and an upper layer 527 of insulating material on the front side of the second die 520. The second die 520 further includes a front-side coil 529 ("coil 529") disposed in the upper layer 527 of insulating material. The coil 529 is formed by a conductor (e.g., a conductive trace) connecting a first end 529a of the coil 529 to a second end 529b of the coil 529 along a substantially spiral-shaped path. As can be seen with reference to FIG. 5, the coil 529 also includes about two and one-half turns (e.g., the spiral-shaped path rotates around the first end 529a through about 900°). The second die 520 further includes a first back-side coil 528 ("coil 528") disposed in a lower layer 521 of insulating material on the back side of the second die 520. The coil 528 is formed by a conductor (e.g., a conductive trace) connecting a first end 528a of the coil 528 to a second end 528b of the coil 528 along a substantially spiral-shaped path. As can be seen with reference to FIG. 5, the coil 528 also includes about two and one-half turns (e.g., the spiral-shaped path rotates around the first end 528a through about 900°). The second die 520 further includes a first TSV 523a extending through the substrate 525 and connected to both (i) the first end 529a of the coil 529, and (ii) the first end 528a of the coil 528. The second die 520 further includes a second TSV 524a extending through the substrate 525 and connected to both (i) the second end 529b of the coil 529, and (ii) the second end 528b of the coil 528.

The second die 520 further includes a second back-side coil 522 ("coil 522") disposed in the lower layer 521 of insulating material. The coil 522 is formed by a conductor (e.g., a conductive trace) connecting a first end 522a of the coil 522 to a second end 522b of the coil 522 along a substantially spiral-shaped path. As can be seen with reference to FIG. 5, the coil 522 includes about two and one-half turns (e.g., the spiral-shaped path rotates around the first end 522a through about 900°). The second die 520 further includes a third TSV 523b extending through the substrate 525 and connected to the first end 522a of the coil 522, and a fourth TSV 524b extending through the substrate 525 and connected to the second end 522b of the coil 522. The third TSV 523b can be connected to other circuit elements (not shown) in the upper layer 527 of insulating material on the front side of the second die 520 by lead 526a. Similarly, the fourth TSV 524b can be connected to other circuit elements (not shown) in the upper layer 527 of insulating material of the second die 520 by lead 526b.

The device further includes a third die 530 having a substrate 535 and an upper layer 537 of insulating material on the front side of the third die 530. The third die 530 further includes a first front-side coil 538 ("coil 538") disposed in the upper layer 537 of insulating material. The coil 538 is formed by a conductor (e.g., a conductive trace) connecting a first end 538a of the coil 538 to a second end 538b of the coil 538 along a substantially spiral-shaped path. As can be seen with reference to FIG. 5, the coil 538 also includes about two and one-half turns (e.g., the spiral-shaped path rotates around the first end 538a through about 900°). The third die 530 further includes a second front-side coil 532 ("coil 532") disposed in the upper layer 527 of insulating material on the front side of the third die 530. The coil 532 is formed by a conductor (e.g., a conductive trace) connecting a first end 532a of the coil 532 to a second end 532b of the coil 532 along a substantially spiral-shaped path. As can be seen with reference to FIG. 5, the coil 532 also includes about two and one-half turns (e.g., the spiral-shaped path rotates around the first end 532a through about 900°). The first front-side coil 538 can be connected to other circuit elements (not shown) in the upper layer 537 of insulating material on the front side of the third die 530 by leads 536a and 536b. Similarly, the second front-side coil 532 can be connected to other circuit elements (not shown) in the upper layer 537 of insulating material of the third die 530 by leads 536c and 536d.

The first die 510 and the second die 520 are stacked front-to-back (e.g., the back side of the first die 510 is facing the front side of the second die 520). The second die 520 and the third die 530 are also stacked front-to-back (e.g., the back side of the second die 520 is facing the front side of the third die 530). The device 500 may optionally include a first die attach material 509 (e.g., a die attach film) between the first and second dies 510 and 520, and a second die attach material 519 (e.g., a die attach film) between the second and third dies 520 and 530.

As set forth in greater detail above, closely-spaced coils, such as the second back-side coil 522 of the second die 520 and the second front-side coil 532 of the third die 530, can be configured to wirelessly communicate over near-field distances (e.g., distances less than about three times the diameter ø of the coils, in which the near-field components of the electric and magnetic fields oscillate). For example, the second back-side coil 522 and the second front-side coil 532 can communicate wirelessly using inductive coupling, in which one of the coils (e.g., the second front-side coil 532 of die 530) is configured to induce a magnetic field with a flux perpendicular to and passing through both the coils 522 and 532 in response to a current passing through the second front-side coil 532 of the third die 530 (e.g., provided by a voltage differential applied across the leads 536c and 536d). By changing the current passing through the second front-side coil 532 (e.g., by applying an alternating current, or by repeatedly switching between high and low voltage states), changes can be induced in the magnetic field, which in turn induces a changing current in the second back-side coil 522 of the second die 520. In this fashion, signals and/or power can be coupled between a circuit comprising the second back-side coil 522 of the second die 520 and another comprising the second front-side coil 532 of the third die 530.

Similarly, the first back-side coil 528 of the second die 520 and the first front-side coil 538 of the third die 530 can be inductively coupled to communicate wirelessly in a similar fashion, as can the back-side coil 518 of the first die 510 and the front-side coil 529 of the second die. As the first back-side coil 528 and the front-side coil 529 of the second die 520 are in electrical communication through the first and second TSVs 523a and 524a of the second die 520, signals and/or power provided to the first front-side coil 538 in the third die 530 (e.g., by leads 536a and 536b) can be provided by inductive coupling to the first back-side coil 528 in the second die 520, which can in turn provide the signals and/or power through the first and second TSVs 523a and 523b of the second die 520 to the front-side coil 529 of the second die 520. The front-side coil 529 of the second die 520 can provide the signals by inductive coupling to the back-side coil 518 in the first die 510, which can in turn provide the signals and/or power through the first and second TSVs 513 and 514 of the first die 510 to circuit elements (not shown) on the front side (e.g., in the upper layer 517 of insulating material) of the first die 510.

Figure 6:
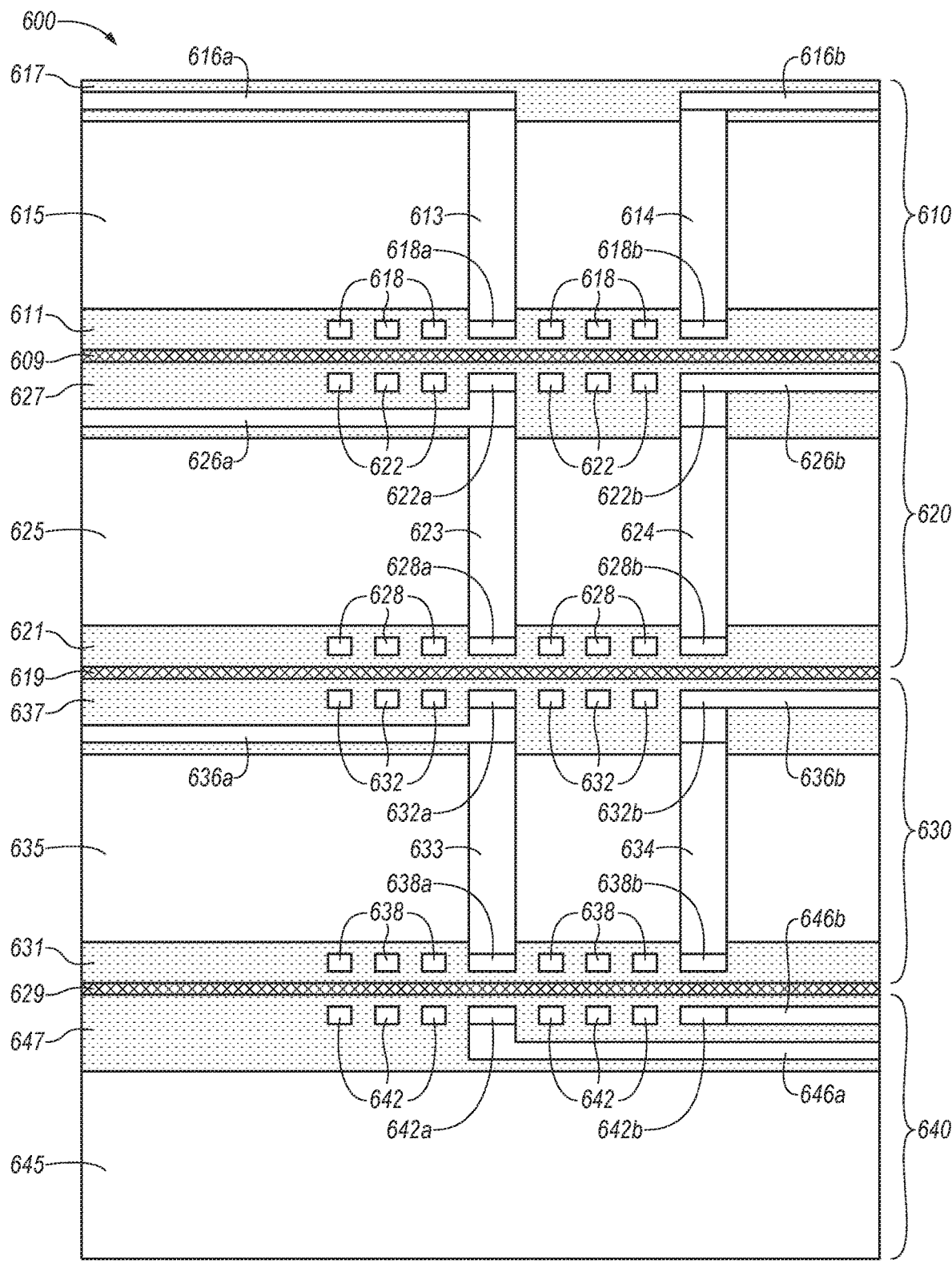
FIG. 6 is a simplified cross-sectional view of a multi-die semiconductor device with back-side coils in accordance with an embodiment of the present technology.

Although in the example device 500 of FIG. 5, elements (e.g., leads) in the front side of each die are shown with a separate connection to leads in the lowermost die by one or more wirelessly-communicating pairs of coils, embodiments of the present technology can also provide the same signals and/or power to circuit elements in the front side of multiple dies in parallel. For example, FIG. 6 is a simplified cross-sectional view of a multi-die semiconductor device 600 with back-side coils in accordance with an embodiment of the present technology. The device 600 includes a first die 610 having a substrate 615 and a lower layer 611 of insulating material on the back side of the first die 610. The first die 610 further includes a back-side coil 618 ("coil 618") disposed in the lower layer 611 of insulating material. The coil 618 is formed by a conductor (e.g., a conductive trace) connecting a first end 618a of the coil 618 to a second end 618b of the coil 618 along a substantially spiral-shaped path. As can be seen with reference to FIG. 6, the coil 618 includes about three and one-half turns (e.g., the spiral-shaped path rotates around the first end 618a through about 1260°. The first die 610 further includes a first TSV 613 extending through the substrate 615 and connected to the first end 618a of the coil 618, and a second TSV 614 extending through the substrate 615 and connected to the second end 618b of the coil 618. The first TSV 613 can be connected to other circuit elements (not shown) in an upper layer 617 of insulating material on the front side of the first die 610 by lead 616a. Similarly, the second TSV 614 can be connected to other circuit elements (not shown) in the upper layer 617 of insulating material of the first die 610 by lead 616b.

The device further includes a second die 620 having a substrate 625 and an upper layer 627 of insulating material on the front side of the second die 620. The second die 620 further includes a front-side coil 622 ("coil 622") disposed in the upper layer 627 of insulating material. The coil 622 is formed by a conductor (e.g., a conductive trace) connecting a first end 622a of the coil 622 to a second end 622b of the coil 622 along a substantially spiral-shaped path. As can be seen with reference to FIG. 6, the coil 622 also includes about three and one-half turns (e.g., the spiral-shaped path rotates around the first end 622a through about 1260°. The second die 620 further includes a back-side coil 628 ("coil 628") disposed in a lower layer 621 of insulating material on the back side of the second die 620. The coil 628 is formed by a conductor (e.g., a conductive trace) connecting a first end 628a of the coil 628 to a second end 628b of the coil 628 along a substantially spiral-shaped path. As can be seen with reference to FIG. 6, the coil 628 also includes about three and one-half turns (e.g., the spiral-shaped path rotates around the first end 628a through about 1260°. The second die 620 further includes a first TSV 623 extending through the substrate 625 and connected to both (i) the first end 622a of the coil 622, and (ii) the first end 628a of the coil 628. The second die 620 further includes a second TSV 624 extending through the substrate 625 and connected to both (i) the second end 622b of the coil 622, and (ii) the second end 628b of the coil 628. The second die 620 further includes leads 626a and 626b in the upper layer 627 of insulating material, for connecting TSVs 623 and 624, respectively, to other circuit elements (not shown).

The device further includes a third die 630 having a substrate 635 and an upper layer 637 of insulating material on the front side of the third die 630. The third die 630 further includes a front-side coil 632 ("coil 632") disposed in the upper layer 637 of insulating material. The coil 632 is formed by a conductor (e.g., a conductive trace) connecting a first end 632a of the coil 632 to a second end 632b of the coil 632 along a substantially spiral-shaped path. As can be seen with reference to FIG. 6, the coil 632 also includes about three and one-half turns (e.g., the spiral-shaped path rotates around the first end 632a through about 1260°. The third die 630 further includes a back-side coil 638 ("coil 638") disposed in a lower layer 631 of insulating material on the back side of the third die 630. The coil 638 is formed by a conductor (e.g., a conductive trace) connecting a first end 638a of the coil 638 to a second end 638b of the coil 638 along a substantially spiral-shaped path. As can be seen with reference to FIG. 6, the coil 638 also includes about three and one-half turns (e.g., the spiral-shaped path rotates around the first end 638a through about 1260°. The third die 630 further includes a first TSV 633 extending through the substrate 635 and connected to both (i) the first end 632a of the coil 632, and (ii) the first end 638a of the coil 638. The second die 630 further includes a second TSV 634 extending through the substrate 635 and connected to both (i) the second end 632b of the coil 632, and (ii) the second end 638b of the coil 638. The third die 630 further includes leads 636a and 636b in the upper layer 637 of insulating material, for connecting TSVs 633 and 634, respectively, to other circuit elements (not shown).

The device further includes a fourth die 640 having a substrate 645 and an upper layer 647 of insulating material on the front side of the fourth die 640. The fourth die 640 further includes a front-side coil 642 ("coil 642") disposed in the upper layer 647 of insulating material. The coil 642 is formed by a conductor (e.g., a conductive trace) connecting a first end 642a of the coil 642 to a second end 642b of the coil 642 along a substantially spiral-shaped path. As can be seen with reference to FIG. 6, the coil 642 also includes about three and one-half turns (e.g., the spiral-shaped path rotates around the first end 642a through about 1260°. The front-side coil 642 can be connected to other circuit elements (not shown) in the upper layer 647 of insulating material on the front side of the fourth die 640 by leads 646a and 646b.

The first die 610 and the second die 620 are stacked front-to-back (e.g., the back side of the first die 610 is facing the front side of the second die 620). The second die 620 and the third die 630 are also stacked front-to-back (e.g., the back side of the second die 620 is facing the front side of the third die 630). The third die 630 and the fourth die 640 are also stacked front-to-back (e.g., the back side of the third die 630 is facing the front side of the fourth die 640). The device 600 may optionally include a first die attach material 609 (e.g., a die attach film) between the first and second dies 610 and 620, a second die attach material 619 (e.g., a die attach film) between the second and third dies 620 and 630, and a third die attach material 629 (e.g., a die attach film) between the third and fourth dies 630 and 640.

As set forth in greater detail above, closely-spaced coils, such as the front-side coil 642 of the fourth die 640 and the back-side coil 638 of the third die 630, can be configured to wirelessly communicate over near-field distances (e.g., distances less than about three times the diameter ø of the coils, in which the near-field components of the electric and magnetic fields oscillate). For example, the front-side coil 642 of the fourth die 640 and the back-side coil 638 of the third die 630 can communicate wirelessly using inductive coupling, in which one of the coils (e.g., the front-side coil 642 of the fourth die 640) is configured to induce a magnetic field with a flux perpendicular to and passing through both the coils 642 and 638 in response to a current passing through the front-side coil 642 of the fourth die 640 (e.g., provided by a voltage differential applied across the leads 646a and 646b). By changing the current passing through the front-side coil 642 (e.g., by applying an alternating current, or by repeatedly switching between high and low voltage states), changes can be induced in the magnetic field, which in turn induces a changing current in the back-side coil 638 of the third die 630. In this fashion, signals and/or power can be coupled between a circuit comprising the back-side coil 638 of the third die 630 and another comprising the front-side coil 642 of the fourth die 640.

Similarly, the front-side coil 632 of the third die 630 and the back-side coil 628 of the second die 620 can be inductively coupled to communicate wirelessly in a similar fashion, as can the front-side coil 622 of the second die 620 and the back-side coil 618 of the first die 610. As the back-side coil 638 and the front-side coil 632 of the third die 630 are in electrical communication through the two TSVs 633 and 634 of the third die 630, signals and/or power provided to the front-side coil 642 in the fourth die 640 (e.g., by the leads 646a and 646b) can be provided via inductive coupling to the back-side coil 638 in the third die 630, which can in turn provide the signals and/or power through the two TSVs 633 and 634 to the front-side coil 632 in the third die. The front-side coil 632 can provide the signals and/or power via inductive coupling to the back-side coil 628 in the second die 620, which can in turn provide the signals and/or power through the two TSVs 623 and 624 of the second die 620 to the front-side coil 622 of the second die 620. The front-side coil 622 can provide the signals and/or power via inductive coupling to the back-side coil 618 in the first die 610, which can in turn provide the signals and/or power through TSVs 613 and 614 to circuit elements (not shown) on the front side (e.g., in the upper layer 617 of insulating material) of the first die 610. Moreover, by providing leads (636a, 636b, 626a and 626b) on the front side of the intermediate dies (e.g., dies 620 and 630) that connect in parallel to the front-side coils (632 and 622) and the TSVs (633, 634, 623, and 624) of those dies that carry the signals and/or power provided to the back-side coil 642 in the fourth die 640 (e.g., by the leads 646a and 646b), circuit elements on the front side of each of the dies (610, 620, 630, and 640) can be connected in parallel to the same signals and/or power.

As will be readily understood by one skilled in the art, a coil need not be smoothly spiral shaped (e.g., an Archimedean spiral or an involute circular spiral) to facilitate wireless communication between front- and back-side coil pairs, in accordance with one embodiment of the present technology. Although the coils in the foregoing example Figures have been illustrated schematically and functionally as having smoothly curving arcuate turns of constant curvature, it will be readily understood by those skilled in the art that fabricating a smooth planar spiral can present a costly engineering challenge (e.g., in photolithographic reticle design). Accordingly, a "substantially spiral-shaped" conductor, as used herein, describes a conductor having turns that increase in radial distance outward from a center, whether gradually or in stepped fashion. Accordingly, the planar shape traced out by the path of individual turns of a substantially spiral-shaped conductor need not be elliptical or circular. For the convenience of integration with efficient semiconductor processing methodologies (e.g., masking with cost-effective reticles), individual turns (e.g., including linear elements thereof) of a substantially spiral-shaped conductor can trace out a polygonal path in a planar view (e.g., rectilinear, hexagonal, octagonal, or some other regular or irregular polygonal shape). Accordingly, a "substantially spiral-shaped" conductor, as used herein, describes a planar spiral conductor having turns that trace out any shape in a planar view (e.g., parallel to the plane of the substrate surface) surrounding a central axis, including circles, ellipses, regular polygons, irregular polygons, or some combination thereof.

Figure 7A:
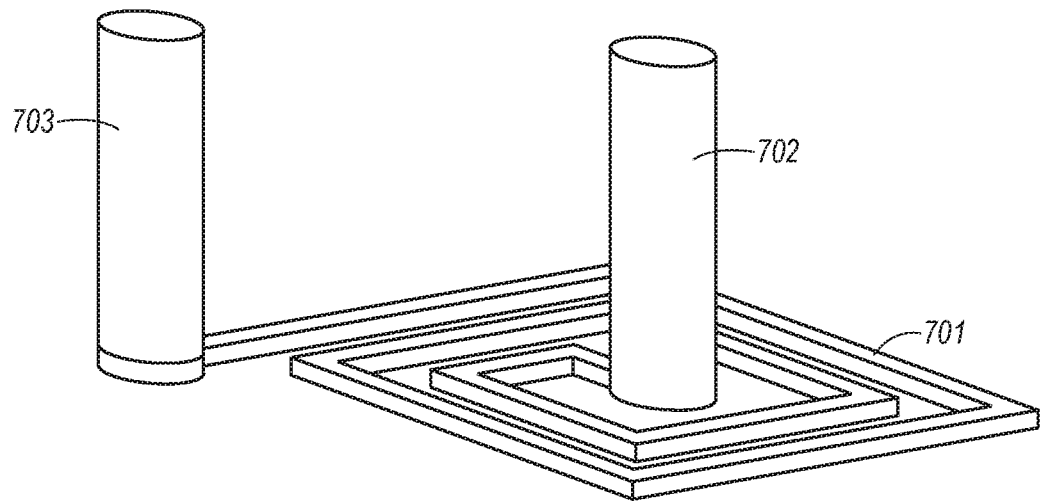
FIGS. 7A-7D are a simplified perspective and schematic views of back-side coils for the wireless coupling of semiconductor devices in accordance with various embodiments of the present technology.

For example, FIG. 7A illustrates a substantially spiral-shaped back-side coil 701 with a substantially polygonal spiral shape, in accordance with one embodiment of the present technology. For more easily illustrating the substantially spiral shape of the coil 701 illustrated in FIG. 7A, the substrate, insulating materials, and other details of the device in which the coil 701 and the TSVs are disposed have been eliminated from the illustration. The coil 701 is connected at its opposite ends to two TSVs 702 and 703. The substantially spiral-shaped conductor of the coil 701 includes linear elements that increase in distance from a central axis of the coil 701 with each turn.

Figure 7B:
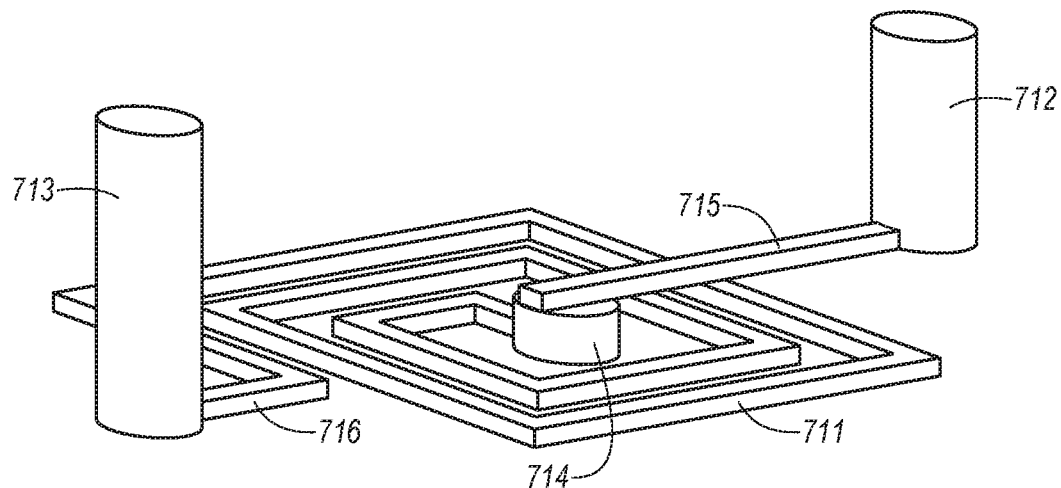
Figure 7C:
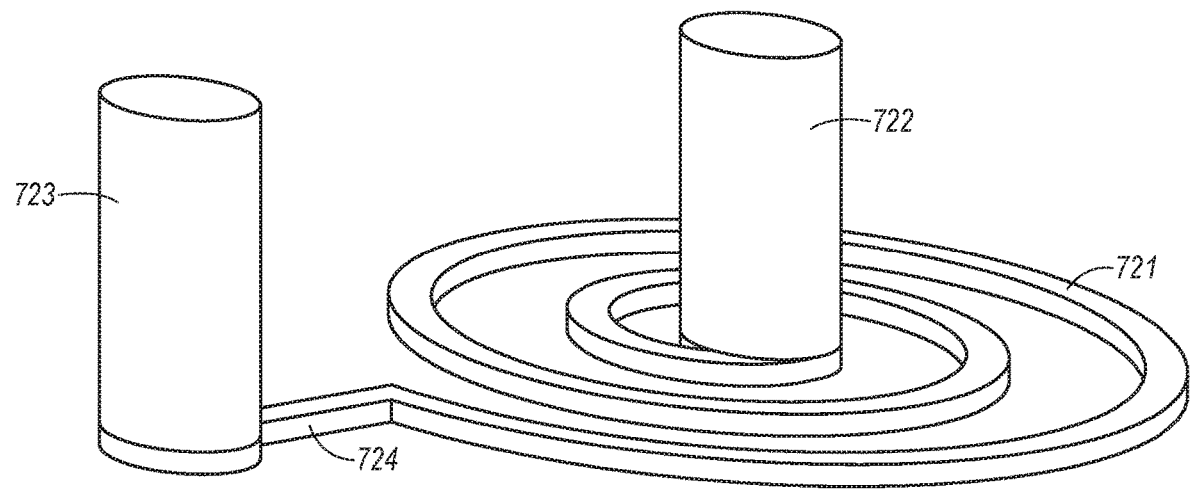

Although FIG. 7A and the foregoing examples have illustrated coils to which TSVs have been directly connected (e.g., at opposite ends of the substantially spiral-shaped conductors), one skilled in the art will readily appreciate that one or both of the TSVs electrically connected to opposite ends of a coil may be located remote from the coil. For example, FIG. 7B illustrates a substantially spiral-shaped back-side coil 711 with a substantially polygonal (e.g., rectangular) spiral shape, in accordance with one embodiment of the present technology. The coil 711 is connected at its central end to a via 714, which in turn is connected by a lead 715 to a TSV 712. Similarly, the outer end of the coil 711 is connected by another lead 716 to another TSV 713. Remotely locating one or both of the TSVs to which a coil is connected may facilitate easier routing and layout. By way of further example, FIG. 7C illustrates a substantially spiral-shaped back-side coil 721 with an arcuate spiral shape in accordance with one embodiment of the present technology, in which only one of the TSVs to which the coil 721 is connected is remotely located from the coil 721. In this regard, the coil 721 is connected at its central end to a first TSV 722 and at its outer end by a lead 724 to a second TSV 723, remote from the coil 721.

Figure 7D:
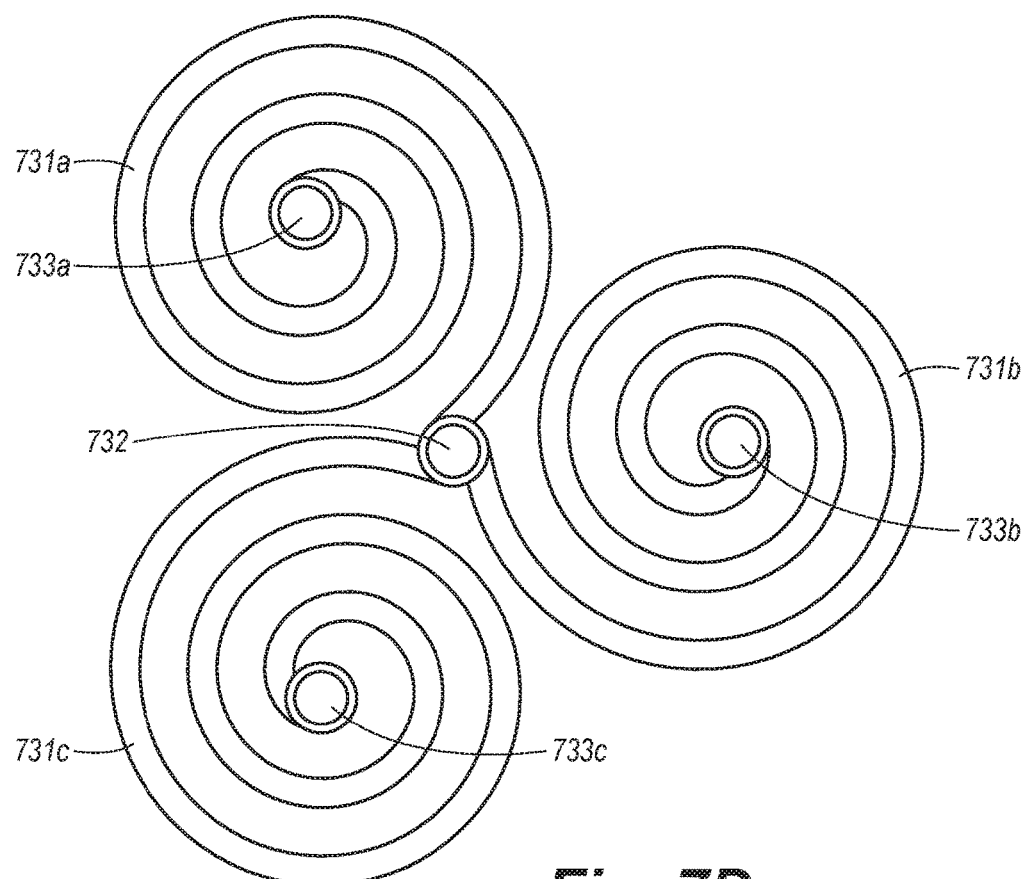

Although in the foregoing embodiments, each back-side coil has been illustrated as being electrically connected to a discrete pair of TSVs, in other embodiments one or more coils can share one or more TSVs (e.g., as a common ground, to provide redundant coverage, to reduce alignment issues, etc.). For example, FIG. 7D is a planar view of an arrangement in which three back side coils 731a, 731b and 731c share a common TSV 732. Each coil 731a, 731b and 731c is further connected to a second TSV 733a, 733b and 733c.

Although the foregoing example embodiments have illustrated substantially spiral coils with turns in a single plane, in other embodiments, a back-side coil having turns at different z-heights could also be provided. For example, a substantially spiral-shaped conductor could have two turns about a central or spiral axis at a first level (e.g., spiraling outward), two turns about a central or spiral axis at a second level (e.g., spiraling inward), and so on in a similar fashion for as many turns as were desired.

Figure 8:
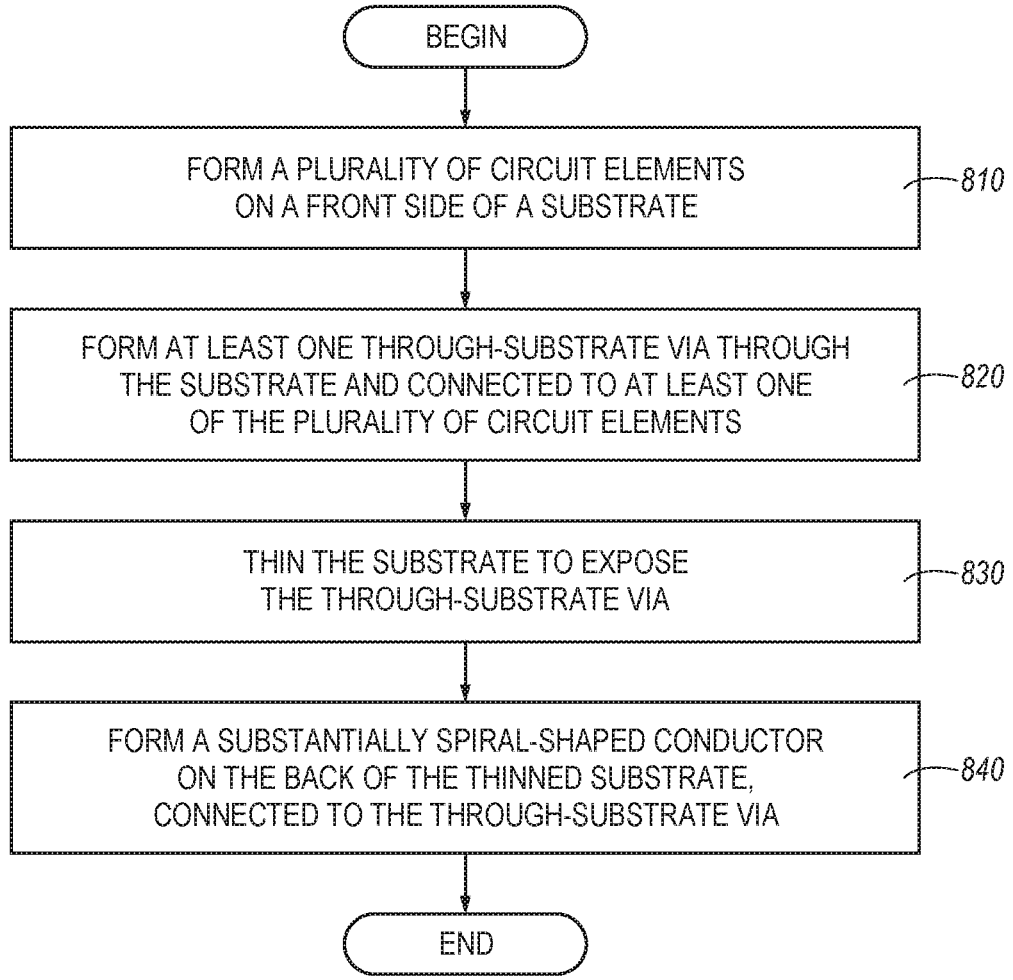
FIG. 8 is a flow chart illustrating a method of manufacturing a semiconductor device with a back-side coil in accordance with an embodiment of the present technology.

FIG. 8 is a flow chart illustrating a method of manufacturing a semiconductor device with a back-side coil in accordance with an embodiment of the present technology. The method includes forming a plurality of circuit elements on a front side of a substrate (e.g., in an insulating layer thereon) (box 810) and forming at least one TSV through the substrate that is connected to at least one of the plurality of circuit elements (box 820). The method further includes thinning the substrate to expose the TSV (box 830) and forming a substantially spiral-shaped conductor (e.g., a coil) on the back side of the thinned substrate, connected to the TSV (box 840).

Figure 9:
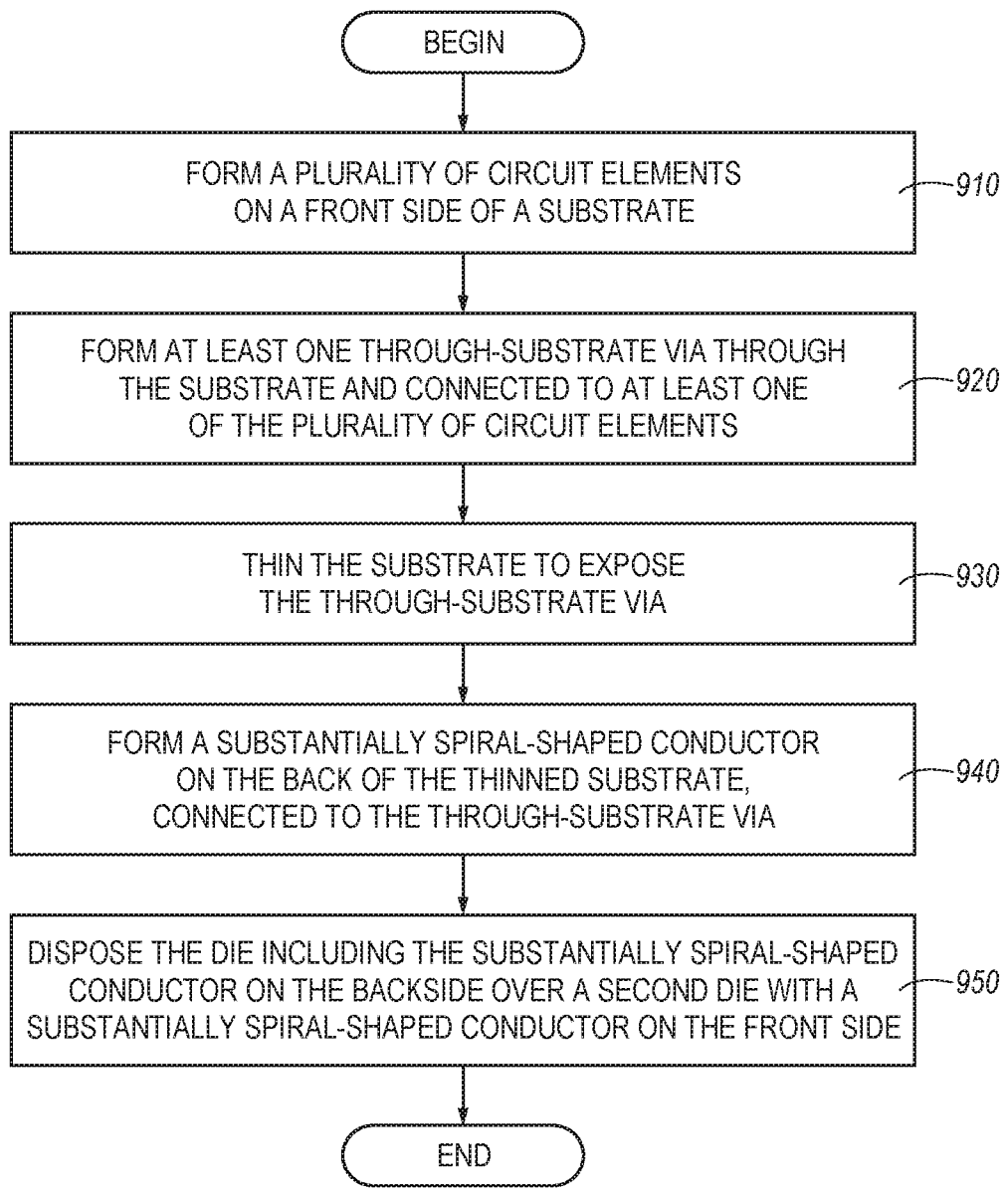
FIG. 9 is a flow chart illustrating a method of manufacturing a semiconductor device with a back-side coil in accordance with an embodiment of the present technology.

FIG. 9 is a flow chart illustrating a method of manufacturing a semiconductor device with a back-side coil in accordance with an embodiment of the present technology. The method includes forming a plurality of circuit elements on a front side of a substrate (e.g., in an insulating layer thereon) (box 910) and forming at least one TSV through the substrate that is connected to at least one of the plurality of circuit elements (box 920). The method further includes thinning the substrate to expose the TSV (box 930) and forming a substantially spiral-shaped conductor (e.g., a coil) on the back side of the thinned substrate, connected to the TSV (box 940). The method further includes disposing the die including the substantially spiral-shaped conductor over a second die with a substantially spiral-shaped conductor on the front side thereof (box 950).

From the foregoing, it will be appreciated that specific embodiments of the invention have been described herein for purposes of illustration, but that various modifications may be made without deviating from the scope of the invention. Accordingly, the invention is not limited except as by the appended claims.

I claim:

1. A semiconductor device, comprising:
   a silicon substrate;
   a first insulating layer on a front side of the silicon substrate;
   a second insulating layer on a back side of the silicon substrate;
   a plurality of circuit elements in the first insulating layer on the front side of the silicon substrate;
   a first substantially spiral-shaped conductor in the second insulating layer on the back side of the silicon substrate;
   a first through-substrate via (TSV) extending through the silicon substrate between the first insulating layer and the second insulating layer and electrically connecting a first end of the substantially spiral-shaped conductor to a first one of the plurality of circuit elements;
   a second TSV extending through the silicon substrate between the first insulating layer and the second insulating layer electrically connecting a second end of the substantially spiral-shaped conductor to a second one of the plurality of circuit elements; and
   a second substantially spiral-shaped conductor in the first insulating layer on the front side of the silicon substrate, coaxially aligned with the first substantially spiral-shaped conductor, and electrically connected to the first substantially spiral-shaped conductor by the first and second TSVs.

2. The semiconductor device of claim 1, wherein the first substantially spiral-shaped conductor is configured to be wirelessly coupled to another substantially spiral-shaped conductor in another semiconductor device.

3. The semiconductor device of claim 1, wherein the first TSV is coaxially aligned with the first and second substantially spiral-shaped conductors.

4. The semiconductor device of claim 1, wherein the first TSV and the second TSV are disposed proximate to but not coaxially aligned with the first substantially spiral-shaped conductor.

5. The semiconductor device of claim 1, wherein the first insulating layer covers the first substantially spiral-shaped conductor.

6. The semiconductor device of claim 1, wherein the silicon substrate is between about 10 and 100 μm thick.

7. The semiconductor device of claim 1, wherein each of the first and second TSV is between about 2 and 50 μm in diameter.

8. The semiconductor device of claim 1, wherein the first and second substantially spiral-shaped conductors each spans an area of between about 80 and 600 μm across.

* * * * *